(12) United States Patent
Li et al.

(10) Patent No.: US 7,041,599 B1
(45) Date of Patent: May 9, 2006

(54) HIGH THROUGH-PUT CU CMP WITH SIGNIFICANTLY REDUCED EROSION AND DISHING

(75) Inventors: Shijian Li, San Jose, CA (US); Fred C. Redeker, Fremont, CA (US); John White, Haywood, CA (US); Ramin Emami, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/469,709

(22) Filed: Dec. 21, 1999

(51) Int. Cl.
*H01L 21/302* (2006.01)

(52) U.S. Cl. .................. 438/692; 438/693; 134/1.1; 216/88; 216/89

(58) Field of Classification Search .............. 438/692, 438/693, 750, 751, 754, 700; 216/88, 89, 216/105; 134/1.3
See application file for complete search history.

(56) References Cited

U.S. PATENT DOCUMENTS

| | | | |
|---|---|---|---|
| 5,014,468 A | 5/1991 | Ravipati et al. | |
| 5,453,312 A | 9/1995 | Haas et al. | |
| 5,454,844 A | 10/1995 | Hibbard et al. | |
| 5,516,346 A | 5/1996 | Cadien et al. | 51/308 |

(Continued)

FOREIGN PATENT DOCUMENTS

| | | |
|---|---|---|
| EP | 1 085 067 | 11/1999 |
| EP | 1 093 161 | 10/2000 |
| EP | 1 057 591 | 12/2000 |
| JP | 11-040526 | 2/1999 |

(Continued)

OTHER PUBLICATIONS

Li, et al., "Barrier Layer Buffing After Cu CMP" filed Sep. 22, 1999, U.S. Appl. No. 09/401,643.
European Search Report for 00311569.8 dated Nov. 12, 2003 (AMAT/3786.EP).
Peterson, et al., "Investigating CMP and Post–CMP Cleaning Issues for Dual–Damascene Copper Technology" Micro Computerist, vol. 17 No. 1 Jan. 1999 pp. 27–32, 34.
Hayashi, et al. "A New Two–Step Metal–CMP Technique for a High Performance Multilevel Interconnects Featured by Al–AND CU in Low Epsilon, Organic Film–Metallizations" 1996 Symposium on VLSI Technology, Digest of Technical Papers pp. 88–89.
Schraub, et al., "Chemical Mechanical Polishing: Future Processing Require CMP Tool Flexibility" Proceedings of the SPIE, vol. 3508 Sep. 1998 pp. 146–154.
Wijekoon, et al. "Development of a Production Worthy Copper CMP Process" Advanced Semiconductor Manufacturing Conference and Workshop, Sep. 1998, pp. 354–363.
U.S. Appl. No. 09/698,864, filed Oct. 27, 2000.
U.S. Appl. No. 09/741,538, filed Dec. 20, 2000.
U.S. Appl. No. 09/808,662, filed Mar. 14, 2001.

*Primary Examiner*—George A. Goudreau
(74) *Attorney, Agent, or Firm*—Moser, Patterson & Sheridan

(57) ABSTRACT

High through-put Cu CMP is achieved with reduced erosion and dishing by a multi-step polishing technique. Deposited Cu is polished with fixed abrasive polishing pads initially at a high removal rate and subsequently at a reduced removal rate and high Cu:barrier layer (Ta) selectivity. Embodiments of the present invention include reducing dishing by: controlling platen rotating speeds; increasing the concentration of active chemicals; and cleaning the polishing pads between wafers. Embodiments also include removing particulate material during CMP by increasing the flow rate of the chemical agent or controlling the static etching rate between about 100 Å and about 150 Å per minute, and recycling the chemical agent. Embodiments further include flowing an inhibitor across the wafer surface after each CMP step to reduce the static etching rate.

26 Claims, 3 Drawing Sheets

U.S. PATENT DOCUMENTS

| | | | |
|---|---|---|---|
| 5,692,950 A | 12/1997 | Rutherford et al. | |
| 5,693,563 A | 12/1997 | Teong | |
| 5,738,574 A | 4/1998 | Tolles et al. | 451/288 |
| 5,820,450 A | 10/1998 | Calhoun | |
| 5,840,629 A | 11/1998 | Carpio | |
| 5,842,910 A | 12/1998 | Krywanczyk et al. | |
| 5,893,796 A | 4/1999 | Birang et al. | |
| 5,897,375 A | 4/1999 | Watts et al. | |
| 5,897,426 A | 4/1999 | Somekh | 451/41 |
| 5,985,748 A * | 11/1999 | Watts et al. | 438/622 |
| 5,994,224 A | 11/1999 | Sandhu et al. | 438/692 |
| 6,001,730 A | 12/1999 | Farkas et al. | 438/627 |
| 6,068,879 A | 5/2000 | Pasch | 427/97 |
| 6,083,840 A | 7/2000 | Mravic, et al. | 438/693 |
| 6,096,652 A | 8/2000 | Watts et al. | 438/692 |
| 6,113,465 A | 9/2000 | Kim et al. | 451/41 |
| 6,184,141 B1 | 2/2001 | Avanzino et al. | 438/692 |
| 6,194,317 B1 | 2/2001 | Kaisaki et al. | 438/692 |
| 6,217,416 B1 | 4/2001 | Kaufman et al. | 451/41 |
| 6,261,157 B1 * | 7/2001 | Bajaj et al. | 451/57 |
| 6,261,158 B1 * | 7/2001 | Holland et al. | 451/63 |
| 6,274,478 B1 | 8/2001 | Farkas et al. | 438/626 |
| 6,315,803 B1 * | 11/2001 | Ina et al. | 51/307 |
| 6,435,945 B1 | 8/2002 | Somekh | 451/41 |
| 6,444,569 B1 | 9/2002 | Farkas et al. | 438/633 |
| 6,555,466 B1 * | 4/2003 | Laursen et al. | 438/626 |
| 2001/0016469 A1 | 8/2001 | Chopra | 451/41 |

FOREIGN PATENT DOCUMENTS

| | | |
|---|---|---|
| WO | 98/49723 | 11/1998 |
| WO | 00/25984 | 5/2000 |
| WO | 00/30154 | 5/2000 |
| WO | 00/35627 | 6/2000 |
| WO | 00/59031 | 10/2000 |

* cited by examiner

HIGH THROUGH-PUT CU CMP WITH SIGNIFICANTLY REDUCED EROSION AND DISHING

TECHNICAL FIELD

The present invention relates to copper (Cu) and/or Cu alloy metallization in semiconductor devices with improved planarity. The present invention is applicable to manufacturing high speed integrated circuits having submicron design features and high conductivity interconnect structures with high production throughput.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance and capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (w). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section. The entire opening is filled with a conductive material, typically a metal, to simultaneously form a conductive plug in electrical contact with a conductive line.

Cu and Cu alloys have received considerable attention as a candidate for replacing Al in interconnect metallizations. Cu is relatively inexpensive, easy to process, and has a lower resistivity than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP, as in Teong, U.S. Pat. No. 5,693,563. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), titanium-titanium nitride (Ti—TiN), titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

In conventional CMP techniques, a wafer carrier assembly is rotated in contact with a polishing pad in a CMP apparatus. The polishing pad is mounted on a rotating turntable or platen driven by an external driving force. The wafers are typically mounted on a carrier or polishing head which provides a controllable force, i.e., pressure, urging the wafers against the rotating polishing pad. Thus, the CMP apparatus effects polishing or rubbing movement between the surface of each thin semiconductor wafer and the polishing pad while dispersing a polishing slurry containing abrasive particles in a reactive solution to effect both chemical activity and mechanical activity while applying a force between the wafer and a polishing pad.

Conventional polishing pads employed in abrasive slurry processing typically comprise a grooved porous polymeric surface, such as polyurethane, and the abrasive slurry varied in accordance with the particular material undergoing CMP. Basically, the abrasive slurry is impregnated into the pores of the polymeric surface while the grooves convey the abrasive slurry to the wafer undergoing CMP. A polishing pad for use in CMP slurry processing is disclosed by Krywanczyk et al. in U.S. Pat. No. 5,842,910. Typical CMP is performed not only on a silicon wafer itself, but on various dielectric layers, such as silicon oxide, conductive layers, such as aluminum and copper, or a layer containing both conductive and dielectric materials as in damascene processing.

A distinctly different type of abrasive article from the above-mentioned abrasive slurry-type polishing pad is a fixed abrasive article, e.g., fixed abrasive polishing pad. Such a fixed abrasive article typically comprises a backing sheet with a plurality of geometric abrasive composite elements adhered thereto. The abrasive elements typically comprise a plurality of abrasive particles in a binder, e.g., a polymeric binder. During CMP employing a fixed abrasive article, the substrate or wafer undergoing CMP wears away the fixed abrasive elements thereby maintaining exposure of the abrasive particles. Accordingly, during CMP employing a fixed abrasive article, a chemical agent is dispersed to provide the chemical activity, while the mechanical activity is provided by the fixed abrasive elements and abrasive particles exposed by abrasion with the substrate undergoing CMP. Thus, such fixed abrasive articles do not require the use of a slurry containing loose abrasive particles and advantageously reduce effluent treatment and dishing as compared to polishing pads that require an abrasive slurry. During CMP employing a fixed abrasive polishing pad, a chemical agent is applied to the pad, the agent depending upon the particular material or materials undergoing CMP. However, the chemical agent does not contain abrasive particles as in abrasive slurry-type CMP operations. Fixed abrasive articles are disclosed by Rutherford et al. in U.S. Pat. No. 5,692,950, Calhoun in U.S. Pat. No. 5,820,450, Haas et al. in U.S. Pat. No. 5,453,312 and Hibbard et al. in U.S. Pat. No. 5,454,844.

Fixed abrasive elements of conventional slurry-less type polishing pads are typically formed in various positive geometric configurations, such as a cylindrical, cubical, truncated cylindrical, and truncated pyramidal shapes, as disclosed by Calhoun in U.S. Pat. No. 5,820,450. Conventional fixed abrasive articles also comprise "negative" abrasive elements, such as disclosed by Ravipati et al. in U.S. Pat. No. 5,014,468.

In applying conventional planarization techniques; such as CMP, to Cu, it is extremely difficult to achieve a high degree surface uniformity, particularly across a surface extending from a dense array of Cu features, e.g., Cu lines, bordered by an open field. A dense array of metal (Cu) features is typically formed in an interlayer dielectric, such as a silicon oxide layer, by a damascene technique wherein trenches are initially formed. A barrier layer, such as a Ta-containing layer e.g., Ta, TaN, is then deposited lining the trenches and on the upper surface of the silicon oxide interlayer dielectric. Cu or a Cu alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8,000 Å to about 18,000 Å. In planarizing the wafer surface after copper metallization, erosion and dishing are typically encountered, thereby decreasing the degree of surface uniformity or planarity and challenging the depth of focus limitations of conventional photolithographic techniques, particular with respect to achieving submicron dimensions, such as below about 0.25 micron. As used throughout this disclosure, the term, "erosion" denotes the height differential between the oxide in the open field and the height of the oxide within the dense array. As also used throughout this disclosure, the term "dishing" denotes a difference in height between the oxide and Cu within the dense array. Erosion typically occurs within the dense array and is believed to be attributed in part to an increase in pressure due to the presence of recesses and, hence, less Cu, generating a pressure differential between the dense array and the open field. Consequently, the removal rate within the dense array is greater than the removal rate in the open field. Accordingly, the barrier layer is reached within the dense array before it is reached in the open field. In fact, conventionally, the oxide layer is reached within the dense array before Cu is completely removed in the open field. Upon removing the barrier layer in the open field, the oxide layer in the dense array is overpolished resulting in erosion. Due to the high selectivity of copper: oxide and copper: tantalum, the copper lines in dense array are overpolished, thereby resulting in dishing.

There exists a need for high-production through-put Cu CMP without erosion and dishing, or with significantly reduced erosion and dishing, thereby achieving a high degree of surface planarity suitable for photolithographic techniques in forming features having dimensions within the deep submicron range.

DISCLOSURE OF THE INVENTION

An advantage of the present invention is a method of planarizing Cu and Cu alloys by CMP at high production through-put with no or significantly reduced erosion and no or significantly reduced dishing.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of planarizing a wafer surface containing: an interlayer dielectric having an upper surface and a plurality of openings; a barrier layer lining the openings and on the upper surface of the interlayer dielectric; and copper (Cu) or a Cu alloy filling the openings and on the interlayer dielectric; the method comprising the sequential steps of: (a) chemical mechanical polishing (CMP) the wafer to reduce the Cu or Cu alloy layer at a first removal rate to thickness of about 500 Å to about 3,000 Å; and (b) CMP the wafer to remove the Cu or Cu alloy layer at a second removal rate, less than the first removal rate, stopping on the barrier layer.

Embodiments of the present invention include conducting step (a) at a first removal rate greater than about 5,000 Å per minute and conducting step (b) at a removal rate of about 1000 Å per minute to about 3000 Å per minute. Erosion is eliminated or at least significantly reduced by conducting CMP operations with fixed abrasive polishing pads at a very high selectively of Cu:Ta or Cu: TaN. During CMP, dishing is controlled to no greater than 300 Å as by reducing the platen rotating speed to achieve a polishing pad temperature no greater than about 50° C., thereby reducing the static etching rate and reducing pad deformation, thus reducing dishing. Particles are removed and temperature is reduced during CMP by flowing the chemical agent across the wafer surface at a high flow rate. The chemical agent or mixture can be recycled to reduce the cost of consumables. An inhibitor is flowed across the wafer surface after each CMP step prior to initiating a subsequent step, to reduce the static etching rate.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
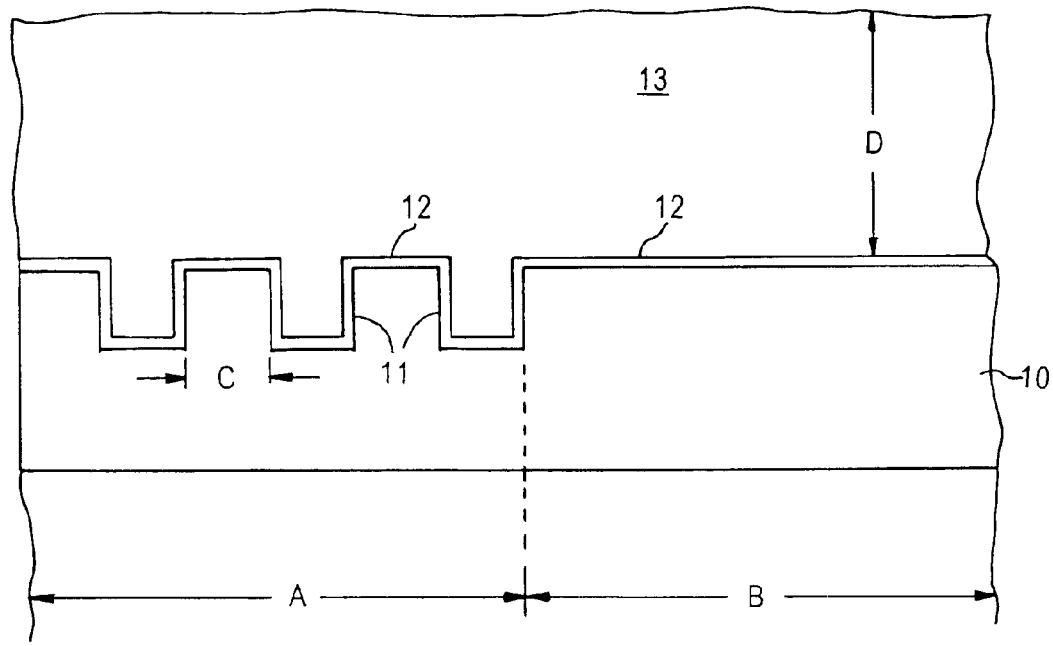
FIGS. 1–4 illustrate sequential phases of a method in accordance with an embodiment of the present invention.

The present invention achieves the heretofore elusive objective of effectively planarizing Cu metallization at high production through-put while eliminating or substantially reducing both erosion and dishing, consistent with the ever increasing demands for reliable interconnect patterns having feature sizes in the deep submicron range. As used throughout this disclosure, the symbol Cu is intended to encompass high purity elemental copper as well as copper-based alloys, e.g., copper-based alloys containing at least about 80 wt. % copper.

The objectives of the present invention are achieved by employing a strategic multi-step process comprising sequential CMP steps by fixed abrasive polishing stopping on the barrier layer with no or significantly reduced dishing and erosion, using one or more rotating platens with a polishing pad mounted thereon, or one or more linear belts. Buffing with an abrasive slurry can then be conducted to remove the barrier layer. The multi-step methodology of the present invention stems from a study of the factors impacting erosion and dishing in planarizing a dense array of Cu features, e.g., lines, bordered by an open field. The expression "dense array" is intended to encompass metal features spaced apart by a variety of distances less than about 100 microns, while the expression "open field" is intended to encompass a field extending in excess of about 100 microns without a metal feature. Erosion and dishing can occur during CMP, for example, when pressure increases within the dense array due to the presence of closely spaced grooves or openings filled with Cu. Accordingly, the polishing rate within the dense array exceeds the polishing rate in the open field resulting in erosion and dishing.

Embodiments of the present invention include a multi-step process comprising: (a) CMP on a first rotating or linear platen employing a fixed abrasive polishing pad or a conventional, non-fixed abrasive polishing pad using an abrasive or abrasive-free chemical agent, at a high removal rate to remove most of the bulk Cu overburden; and (b) CMP on a second rotating or linear platen employing a fixed abrasive polishing pad or a conventional, non-fixed abrasive polishing pad using an abrasive or abrasive-free chemical agent, at a reduced removal rate with high selectivity to and stopping on the Ta or TaN barrier layer. Buffing on a third rotating or linear polishing pad can then be conducted, using an abrasive slurry, to remove the Ta or TaN barrier layer. The surface of the silicon oxide interlayer dielectric is also buffed to reduce or eliminate scratching and defects. The polishing pads are mounted on rotating platens. Multi-station CMP systems are commercially available, such as the Mirra® polisher, available from Applied Materials, Inc., Santa Clara, California.

In accordance with embodiments of the present invention, the Cu metal film is effectively planarized by a multi-step process eliminating or substantially reducing erosion and dishing, thereby enabling use of conventional photolithograpy to form metal features having dimensions in the deep submicron range. A typical Cu metallization or interconnect system comprises, but is not limited to, interconnects formed by damascene technology. Such interconnects are formed by depositing a interlayer dielectric overlying a substrate, forming an opening, e.g., a damascene opening, in the interlayer dielectric, depositing a diffusion barrier, such as a TaN or Ta, and filling the opening with Cu. Advantageously, the opening in the interlayer dielectric can be filled by initially depositing a seedlayer and then electroplating or electroless plating the Cu layer, typically at a thickness of about 8,000 Å to about 18,000 Å. The damascene openings can also be filled with Cu by PVD at a temperature of about 50° C. to about 150° C. or by CVD at a temperature under about 200° C.

Conventional substrates and interdielectric layers are encompassed by the present invention. For example, the substrate can be doped monocrystalline silicon or gallium-arsenide. The interlayer dielectric can comprise any of various dielectric materials conventionally employed in the manufacture of semiconductor devices. For example, dielectric materials, such as silicon dioxide, phospho-doped silicon glass (PSG), boron-phospho-doped silicon glass (BPSG) and silicon dioxide derived from tetraethyl orthosilicate (TEOS) or silane by plasma enhanced chemical vapor deposition (PECVD) can be employed. Interlayer dielectrics in accordance with the present invention can also comprise low dielectric constant materials, including polymers, such as polyimides, and carbon-containing silicon dioxide, e.g., Black Diamond® available from Applied Materials, Inc., located in Santa Clara, Calif. The openings are formed in interlayer dielectrics by conventional photolithographic and etching techniques.

During the initial step (a), the Cu metallized wafer surface is subjected to CMP on a polishing pad mounted on a rotating or linear platen to effect bulk Cu removal at a relatively high removal rate for rapid through-put, e.g., a removal rate greater than about 5,000 Å per minute, down to a thickness of about 500 Å to about 3,000 Å. CMP essentially involves a combination of chemical action and mechanical abrasion. The chemical action basically comprises oxidizing the surface of the metal, i.e., Cu, which is then mechanically abraded by the fixed abrasive elements or posts of the polishing pad. Given the guidance disclosed herein and the disclosed objectives, suitable CMP conditions and chemical agents can be readily determined in a particular situation. Suitable chemical agents can include sodium chromate tetrahydrate as disclosed by Carpio in U.S. Pat. No. 5,840,629, and/or a carboxylate salt, such as ammonium citrate, as disclosed by Watts et al. in U.S. Pat. No. 5,897,375. Advantageously, an inhibitor, such as a triazole or a triazole derivative, e.g., 1,2,4-triazole or benzotriazole, can be employed. The chemical agent can also include a solvent, such as deionized water or an alcohol.

For example, in an interconnection system comprising a silicon dioxide interlayer dielectric and TaN barrier layer, the chemical agent can comprise about 1 to about 10 wt. % of an oxidizer, e.g., about 6 wt. %, such as hydrogen peroxide, about 0.05 to about 0.20 wt. % of an inhibitor, e.g., about 0.15 wt. %, such as 5-methyl benzotriazole, about 1.0 to about 5.0 wt. % e.g., about 3 wt. %, of a chelating agent, such as iminodiaetic acid, and about 3.0 to about 15.0 wt. %, e.g., about 9.0 wt. %, of another chelating agent, such as ammonium hydrogen phosphate, the balance deionized water. The pressure is typically about 3 psi. The concentration of the inhibitor can be strategically adjusted throughout the polishing steps of the present invention to control the static etching rate. For example, the static etching rate can be decreased by increasing the amount of inhibitor, thereby reducing chemical complexing of Cu by chelating components of the chemical agent.

During step (b), the remainder of the bulk Cu overlying the barrier layer, typically a thickness of about 500 Å to about 3,000 Å, is removed by CMP on a rotating or linear fixed abrasive polishing pad employing a chemical agent with high selectivity to and stopping on the TaN barrier layer. CMP step (b) is conducted at a lower removal rate than during CMP step (a) e.g., at removal rate about 1,000 Å to about 3,000 Å per minute, by suitable adjustment of conditions, such as reduced pressure, e.g., employing a pressure no greater than about 3 psi. Steps (a) and (b) can be performed on one or more rotating platens with a polishing pad mounted therein or on one or more linearly moving belts. The chemical agent employed during CMP step (b) can comprise about 0.05 to about 6.0 wt. %, e.g., about 3 wt. %, of an oxidizer, such as hydrogen peroxide, about 0.03 to about 0.15 wt. %, e.g., about 0.06 wt. %, of an inhibitor, e.g. 5-methyl-benzotriazole, about 0.5 to about 2.0 wt. % e.g., about 1.0 wt. %, of a chelating agent, e.g., iminodiacetic acid, about 1.0 to about 6 wt. %, e.g., about 3 wt. % of another chelating agent, such as ammonium hydrogen phosphate, the balance deionized water. The pressure is typically about 2 psi. CMP having high selectivity to the Ta or TaN barrier metal layer enables complete removal of Cu and stopping on the Ta or TaN barrier layer. The CMP end point on reaching the Ta or TaN barrier layer can be accurately determined employing a conventional optical system, such as the laser interferometer technique disclosed in U.S. Pat. No. 5,893,796, the entire disclosure of which is incorporated by reference herein. The ISRM® system marketed by Applied Materials, Inc., of Santa Clara, Calif. can be employed for end point detection, thereby significantly minimizing overpolishing.

The water surface is then buffed, in a conventional manner. Embodiments of the present invention comprise further refinements to minimize dishing. It was found that dishing can be controlled during CMP steps (a) and (b) by controlling one or more processing features or parameters. For example, embodiments of the present invention comprise controlling the polishing pad surface at a temperature at no greater than about 44° C., as by reducing the platen rotating speed to no greater than 40 rpm, thereby reducing static etching and, hence, dishing. It should be appreciated that the static etching rate should not be reduced to the extent that the polishing by-products generated during CMP can not be removed, e.g., dissolved. The polishing by-products generated during CMP can be flushed away with a high flow of chemical agent which can be recycled to reduce the cost of consumables.

It was also found that Cu recess, thus dishing, can be reduced by reducing chemical starvation on top of the flat posts of the abrasive polishing pad that contact the Cu surface. Conventional fixed abrasive polishing pads comprise a plurality of fixed abrasive composite elements, each comprising abrasive particles dispersed in a polymeric binder, and are often referred to as posts. Such posts typically have a height of about 40 microns to about 50 microns and, when in the form of a cylinder, a diameter of about 200 microns, providing a contact area ratio of about 10% to about 25%. The posts can be formed in the shape of various geometric configurations, such as polygons, circles and ellipsis. As used throughout this disclosure, the term diameter is intended to denote the largest cross-sectional dimension of the upper working surface of the posts confronting the surface undergoing CMP.

It was found that chemical starvation can be reduced by reducing the diameter of the posts while maintaining substantially same contact area ratio of about 10% to about 25% by increasing the number of posts. Accordingly, embodiments of the present invention comprise conducting CMP steps (a) and (b) using fixed abrasive polishing pads comprising abrasive posts having a diameter of about 75 microns to about 150 microns, e.g., about 100 microns to about 150 microns, thereby reducing chemical starvation and, hence, reducing dishing.

It was also found that dishing during CMP steps (a) and (b) can be reduced by increasing the stiffness or rigidity of the backing sheet on which the abrasive posts are adhered. This can be achieved by selecting a backing sheet material having a suitable Young's Modulus (Modulus of Elasticity). Alternatively, the thickness of a conventional backing sheet, e.g., polycarbonate backing sheet, can be increased to reduce the pad softness and, hence, reduce the pressure within the dense array, thereby reducing dishing.

It was further found that the dishing can be decreased, as to less than about 300 Å, by increasing the amount of inhibitor in the chemical agent during CMP step (b). Accordingly, embodiments of the present invention comprise conducting CMP step (b) with a chemical agent comprising about 0.5 to about 1.0 wt. % of an inhibitor, e.g., 5-methyl benzotriazole. Further improvements in dishing can be achieved by increasing the concentration of the active components of the chemical agent, e.g., by a factor of about three.

Embodiments of the present invention comprise effectively removing particles generated during CMP steps (a) and (b) by flowing the chemical agent across the surface of the wafer at a relatively high flow rate, such as above about 300 milliliters per minute, and recycling the chemical agent. Removal of such particles can also be achieved by maintaining the static etching rate up to about 200 Å per minute.

Further improvements in planarity, i.e., dishing and erosion, are achieved in embodiments of the present invention by immediately flooding the wafer surface and polishing pad with an inhibitor, such as benzotriazole, upon completing CMP step (a) before initiating CMP step (b) and upon completing CMP step (b) before initiating buffing, thereby effectively removing CMP debris while avoiding static etching. The use of an inhibitor vis-à-vis deionized water upon terminating each of the CMP steps effectively prevents undue static etching to provide a relatively clean and low defect wafer prior to initiating the subsequent step.

An embodiment of the present invention is schematically illustrated in FIGS. 1–4, wherein similar features bear similar reference numerals. Adverting to FIG. 1, interlayer dielectric 10, e.g., silicon oxide, is formed overlying a substrate (not shown). A plurality of openings 11 are formed in a designated area A in which a dense array of conductive lines are to be formed bordering open field B. A barrier layer 12, e.g., TaN, is deposited lining the openings 11 and on the upper surface of silicon oxide interlayer dielectric 10. Typically, the openings 11 are spaced apart by a distance C, e.g., 0.2 to about 50 microns. Cu layer 13 is then deposited at thickness D of about 8,000 Å to about 18,000 Å.

Figure 2:
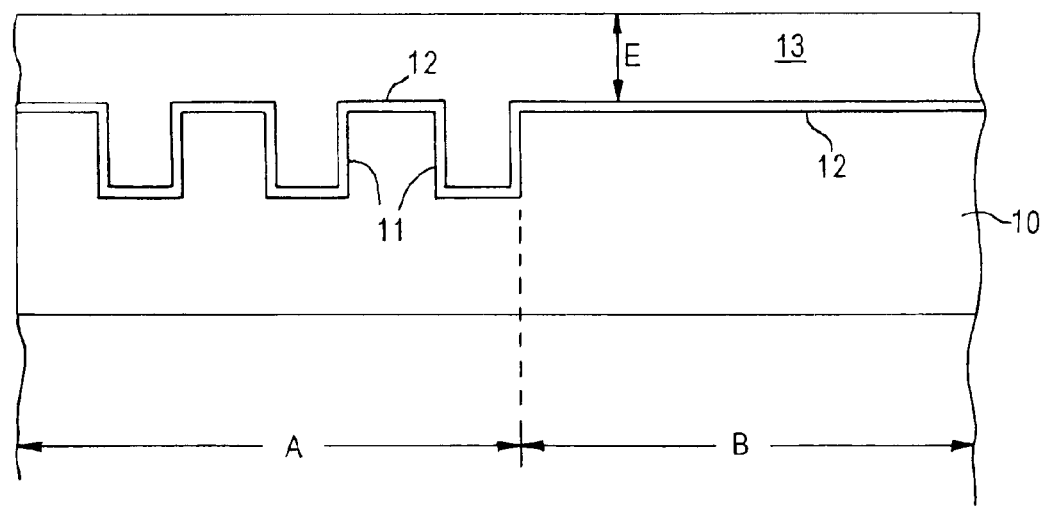
Figure 3:
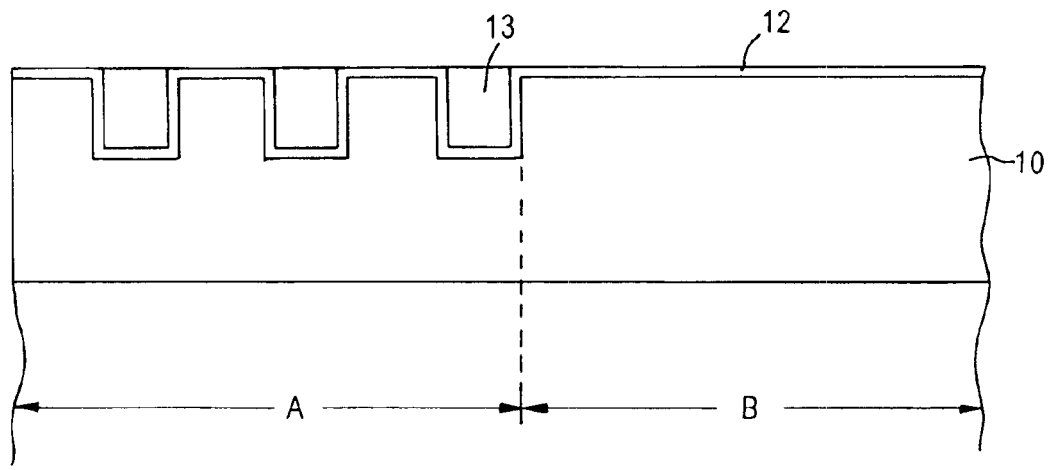

Adverting to FIG. 2, CMP step (a) is conducted as to reduce the Cu layer 13 to a thickness E of about 500 Å to about 3,000 Å at a removal rate in excess of about 5,000 Å per minute. As shown in FIG. 3, CMP step (b) is conducted with high selectivity to TaN barrier layer 12 stopping thereon.

Figure 4:
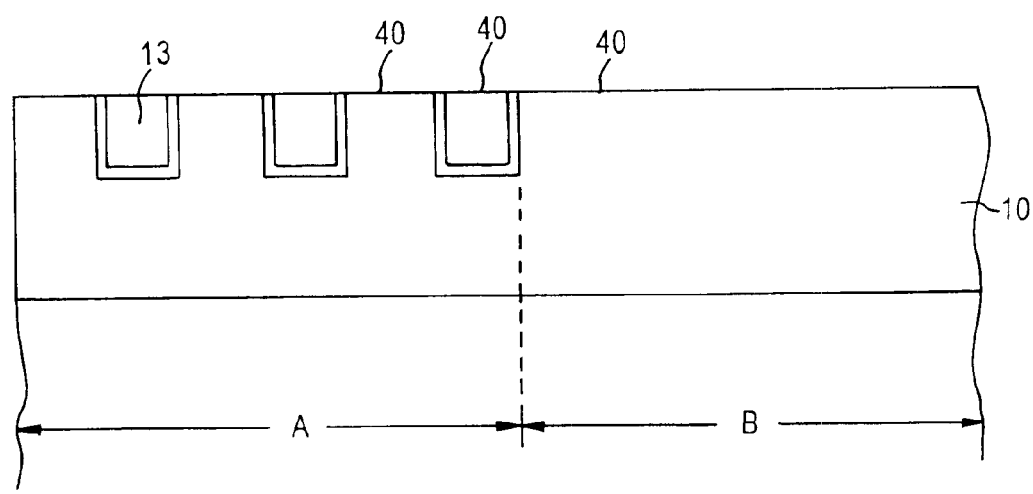

As shown in FIG. 4, buffing is conducted, as with no or reversed selectively to remove TaN layer 12 and buff the silicon oxide surface to remove or reduce scratching or defects, thereby completing planarization. The resulting Cu interconnection structure comprises a dense array A of Cu lines 13 bordered by open field B. The upper surface 40 exhibits a very high degree of planarity with virtually no erosion or dishing.

Figure 5:
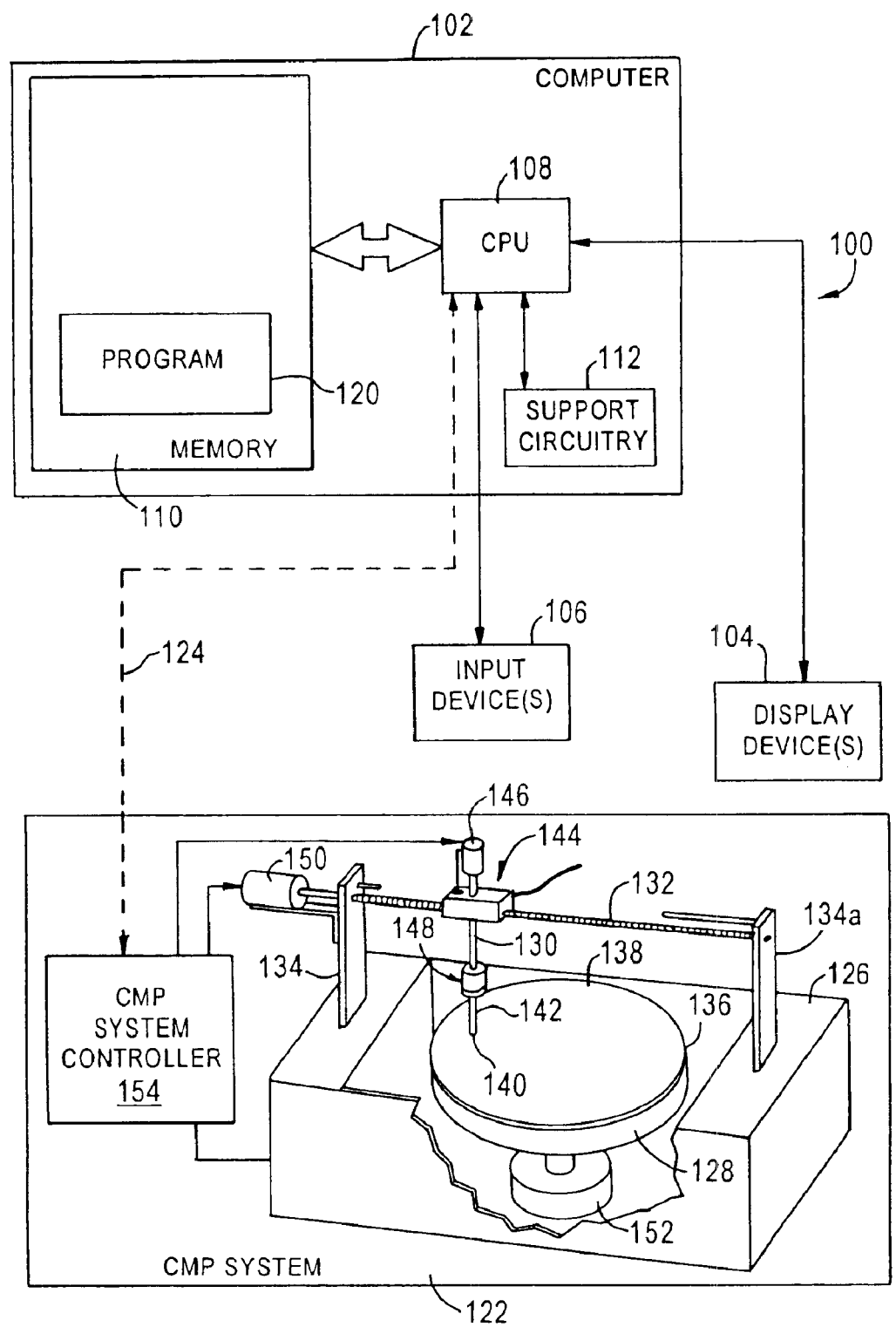
FIG. 5 depicts a block diagram of a computer system configured for controlling a CMP system in accordance with an embodiment of the present invention.

One aspect of the present invention is related to the use of a computer system to control a CMP system for planarizing a wafer. FIG. 5 depicts a general purpose computer system 100 configured to execute a software for controlling CMP system 122. The computer system 100 contains a computer 102, one or more display devices 104, and one or more input devices 106. The computer 102 contains a central processing unit (CPU) 108 such as an Intel 486 microprocessor, a memory 110 and assorted support circuitry 112 such as a math co-processor, power supply, and the like. Such computer systems are commonly known as personal computer; however, the present invention is not limited to personal computers and can, in fact, be implemented on workstations, minicomputer, mainframes, and supercomputers. The input devices 106 used with such computers include a keyboard, a mouse, trackball and the like. The display devices 104 include computer monitors, printers and plotters.

Computer system 100 also includes a memory 110, such as a random access memory (RAM) or other dynamic storage device for storing information and instructions to be executed by CPU 108. Memory 110 also may be used for storing temporary variables or other intermediate information during execution of instructions to be executed by CPU 108. Memory 110 further includes a read only memory (ROM) or other static storage device for storing static information and instructions for CPU 108. Memory 110 may also include a storage device, such as a magnetic disk or optical disk, provided for storing information and instructions.

The interface 124 allows the computer system 100 to communicate with the CMP system 122, specifically with CMP system controller 154. The CMP system 122 could either be a small pad or a large pad system, or a linear belt polishing system. Illustratively, a small pad system is depicted. The small pad system generally includes a base 126 for rotatably supporting a rotating plate 128 therein, and a moveable tubular polishing arm 130 suspended over the rotating plate 128 and supported on a cross arm 132. The cross arm is maintained on the base and over the plate by opposed uprights 134, 134a which extend upwardly from the base. The rotating plate preferably includes a conformable pad fixed to its upper surface. A substrate 136, having an upper surface 138 to be polished, is placed on the polishing pad to maintain the substrate in position beneath the polishing arm as the substrate is polished. The tubular polishing arm 130, with a polishing pad 140 located over the lower open end 142 thereof, is moved generally radially across the upper surface of the substrate to perform the polishing. The polishing pad is preferably continuously moved linearly across the rotating substrate, from the edge to center, until the polishing end point is attained (e.g., a predefined degree of surface non-uniformity).

CMP system controller 154 controls motion of the rotating plate (or linearly moving belt) and motion of the polishing arm. Specifically, the control system controls the rotational velocity of motor 152 that is coupled to plate 128. Also, the linear motion is provided by motor 150 coupled to cross arm 132. Linear positioning mechanism 144, under control of the controller 154, controls the pressure of the pad on the substrate surface through a load mechanism 148 and controls the rotation of the pad through motor 146. As such, controller 154 controls all aspects of this small pad CMP polishing system.

According to an embodiment of the present invention, planarizing a wafer surface is provided by computer system 100 controlling CMP system 122 in response to CPU 108 executing one or more sequences of none or more instructions contained in a program 120 in memory 110. For example, instructions can be read into main memory from another computer-readable medium, such as a storage device. Execution of the sequences of instructions contained in memory 110 causes CPU 108 to perform the process step described herein. One or more processors in a multi-processing arrangement may also be employed to execute the sequences of instructions contained in memory 110. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to CPU 108 for execution. Such a medium may take many forms, including but not limited to, nonvolatile media, volatile media, and transmission media. Non-volatile media include for example, optical or magnetic disks, such as a storage device. Volatile media include dynamic memory, such as a main memory. Transmission media include coaxial cables, copper wire and fiber optics, including the wires that comprise a system bus. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to CPU 108 for execution. For example, the instructions, may be initially be borne on a magnetic disk of a remote computer. The remote computer can load the instructions into its dynamic memory and send the instructions over a telephone line using a modem. A modem (not shown) local to computer system 100 can receive the data on the telephone line and use an infrared transmittal to convert the data to an infrared signal. An infrared detector as an input device 106 can place the data on the system bus, which carries the data to memory 110, from which CPU 108 retrieves and executes the instructions. The instructions received at memory 110 may optionally be stored on storage device either before or after execution by CPU 108.

The present invention is applicable to planarizing during various stages of semiconductor manufacturing. The present invention enjoys particular applicability in the manufacture of high density semiconductor devices with metal features in the deep submicron range.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of planarizing a substrate surface containing a copper or copper alloy layer disposed on a barrier layer comprising:
   (a) polishing the substrate surface on a first platen with a first polishing composition to reduce a copper or copper alloy layer at a first removal rate, wherein the first polishing composition comprises:
      about 1 wt. % to about 10 wt. % of an oxidizer;
      about 0.05 wt. % to about 0.20 wt. % of an inhibitor;
      about 1.0 wt. % to about 5.0 wt. % of a first chelating agent;
      about 3.0 wt. % to about 15.0 wt. % of a second chelating agent, wherein the first chelating agent is different from the second chelating agent;
      and deionized water; and
   (b) polishing the substrate on a second platen with a second polishing composition to remove the copper or copper alloy layer at a second removal rate less than the first removal rate, wherein the second composition comprises an oxidizer.

2. The method according to claim 1, further comprising removing the barrier layer on a third platen.

3. The method according to claim 1, wherein the first removal rate is greater than about 5,000 Å per minute and the second removal rate is between about 1000 Å per minute and about 3,000 Å per minute.

4. The method according to claim 2, wherein the barrier layer comprises tantalum (Ta) or tantalum nitride (TaN) and is disposed on a dielectric material.

5. The method according to claim 1, wherein polishing at the second removal rate is performed at a removal rate ratio of copper layer to barrier layer of greater than about 100:1.

6. The method according to claim 5, wherein polishing at the second removal rate is performed under conditions such that dishing within the dense array is about 300 Å or less.

7. The method according to claim 6, wherein the first platen and the second platen each comprise a polishing pad mounted on a rotating, stationary, or linear platen.

8. The method according to claim 7, wherein the first and second platens are rotated during polishing at less than about 60 rpm or first and second belts disposed on the first and second platens are moved linearly at a rate of less than about 30 inches per second.

9. The method according to claim 7, further comprising cleaning the polishing pads by removing debris and polishing by-products.

10. The method according to claim 1, further comprising recycling the first polishing composition, the second polishing composition, or both.

11. The method according to claim 7, wherein the first polishing composition is delivered to the first platen at a flow rate of about 300 milliliters per minute or greater and the second polishing composition is delivered to the second platen at a flow rate of about 300 milliliters per minute or greater.

12. The method according to claim 7, wherein the static removal rate of the copper or copper alloy by the first polishing composition and the second polishing composition is about 150 Å per minute or less.

13. The method according to claim 1, further comprising exposing a polishing pad disposed on the first platen or the substrate surface to an inhibitor after polishing at the first removal rate and prior to polishing at the second removal rate.

14. The method according to claim 13, further comprising exposing a polishing pad disposed on the second platen or the substrate surface to an inhibitor after polishing at the second removal rate and prior to removing the barrier layer.

15. The method according to claim 7, further comprising:
exposing the first polishing pad or the substrate surface to an inhibitor after polishing at the first removal rate and prior to polishing at the second removal rate;
exposing the second polishing pad or the substrate surface to an inhibitor after polishing at the second removal rate; and
recycling the first polishing composition, the second polishing composition, or both.

16. The method of claim 1, wherein the method steps for processing a substrate surface comprise a series of instructions disposed in comprise a computer-readable medium adapted to implement instructions for planarizing the wafer surface by a chemical mechanical (CMP) system when said instructions are arranged and executed by one or more processors connected to the chemical mechanical (CMP) system.

17. The method of claim 1, wherein the first polishing composition comprises an abrasive-free polishing composition.

18. The method of claim 17, wherein the first polishing composition comprises:
about 6 wt. % of hydrogen peroxide;
about 0.15 wt. % of 5-methyl benzotriazole;
about 3 wt. % of iminodiaetic acid;
about 9.0 wt. % of ammonium hydrogen phosphate; and
deionized water.

19. A method of planarizing a substrate surface containing a copper or copper alloy layer disposed on a barrier layer comprising:
(a) polishing the substrate surface on a first platen with a first polishing composition to reduce a copper or copper alloy layer at a first removal rate, wherein the first composition comprises an oxidizer; and
(b) polishing the substrate on a second platen with a second polishing composition to remove the copper or copper alloy layer at a second removal rate less than the first removal rate, wherein the second polishing composition comprises:
about 0.05 wt. % to about 6.0 wt. % of an oxidizer;
about 0.03 wt. % to about 0.15 wt. % of an inhibitor;
about 0.5 wt. % to about 2.0 wt. % of a first chelating agent;
about 1.0 wt. % to about 6 wt. % of a second chelating agent, wherein the first chelating agent is different from the second chelating agent; and
deionized water.

20. The method of claim 19, wherein the second polishing composition is an abrasive-free polishing composition comprising:
about 3 wt. % of hydrogen peroxide;
about 0.06 wt. % of 5-methyl-benzotriazole;
about 1.0 wt. % of iminodiacetic acid;
about 3 wt. % of ammonium hydrogen phosphate; and
deionized water.

21. The method of claim 1, wherein polishing the substrate on the first platen is performed at a first polishing pressure and polishing the substrate on the second platen is performed at a second polishing pressure less than the first polishing pressure.

22. The method of claim 21, wherein the first polishing pressure is about 3 psi or greater.

23. The method of claim 21, wherein the second polishing pressure of less than about 3 psi.

24. The method of claim 21, wherein the first polishing pressure is 3 psi and the second polishing pressure is 2 psi.

25. The method of claim 7, wherein the first polishing pad and the second polishing pad are maintained at a temperature of about 50° C. or less during polishing the substrate surface.

26. The method of claim 1, wherein the first abrasive free polishing composition comprises a corrosion inhibitor concentration between about 0.05 wt. % and about 0.20 wt. % and the second fixed abrasive polishing composition has a corrosion inhibitor concentration between about 0.5 wt. % and about 1.0 wt. %.

* * * * *

UNITED STATES PATENT AND TRADEMARK OFFICE
CERTIFICATE OF CORRECTION

PATENT NO.        : 7,041,599 B1                                              Page 1 of 1
APPLICATION NO.   : 09/469709
DATED             : May 9, 2006
INVENTOR(S)       : Shijan Li et al.

It is certified that error appears in the above-identified patent and that said Letters Patent is hereby corrected as shown below:

Column 1, Line 47: Change "(w)" to --(W)--

Column 3, Line 9: Change the semicolon to a comma

Column 3, Line 29: Change "particular" to --particularly--

Column 5, Line 47: Before "interlayer", change "a" to --an--

Column 6, Line 37: Change "iminodiaetic" to --iminodiacetic--

Column 7, Line 13: After "manner", insert --with abrasive, to remove to Ta or TaN barrier layer, under conditions such that there is no or reversed selectivity among the silicon oxide interlayer dielectic, barrier layer and Cu.--

Column 9, Line 50: Change "none" to --one--

Column 10, Line 21: Delete the comma after "instructions"

Column 10, Line 21: After "initially", delete "be"

Column 11, Claim 16, Line 58: Before "a computer-readable", delete "comprise"

Column 12, Claim 18, Line 9: Change "iminodiaetic" to --iminodiacetic--

Column 12, Claim 23, Line 50: Change "of" to --is--

Signed and Sealed this

Twelfth Day of September, 2006

JON W. DUDAS
*Director of the United States Patent and Trademark Office*